(12) United States Patent
Zeller

(10) Patent No.: US 10,310,043 B2
(45) Date of Patent: Jun. 4, 2019

(54) METHOD AND APPARATUS FOR THE CORRECTION OF MAGNETIC RESONANCE SCAN DATA

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 436 days.

(21) Appl. No.: 15/166,475

(22) Filed: May 27, 2016

(65) Prior Publication Data

US 2016/0349343 A1    Dec. 1, 2016

(30) Foreign Application Priority Data

May 28, 2015 (DE) .................. 10 2015 209 838

(51) Int. Cl.
  *G01R 33/561* (2006.01)
  *G01R 33/565* (2006.01)

(52) U.S. Cl.
  CPC ... *G01R 33/5616* (2013.01); *G01R 33/56554* (2013.01); *G01R 33/56563* (2013.01)

(58) Field of Classification Search
  CPC ............. G01R 33/56554; G01R 33/56563
  USPC ........................................... 324/309
  See application file for complete search history.

(56) References Cited

U.S. PATENT DOCUMENTS

| | | | | |
|---|---|---|---|---|
| 4,970,457 A | * | 11/1990 | Kaufman | G01R 33/56563 324/307 |
| 5,151,656 A | * | 9/1992 | Maier | G01R 33/56554 324/307 |
| 5,621,321 A | * | 4/1997 | Liu | G01R 33/56554 324/307 |
| 5,869,965 A | * | 2/1999 | Du | G01R 33/56554 324/307 |
| 5,886,524 A | * | 3/1999 | Krieg | G01R 33/56572 324/307 |

(Continued)

OTHER PUBLICATIONS

Xiang et al: "Correction for Geometric Distortion and N/2 Ghosting in EPI by Phase Labeling for Additional Coordinate Encoding (PLACE)", Magnetic Resonance in Medicine, vol. 57, pp. 731-741, (2007).

(Continued)

*Primary Examiner* — Patrick Assouad
*Assistant Examiner* — Demetrius R Pretlow
(74) *Attorney, Agent, or Firm* — Schiff Hardin LLP

(57) ABSTRACT

In a method and magnetic resonance (MR) apparatus for correcting MR scan data, an MR scanner is operated to acquire first and second correction data sets respectively from first and second sub-volumes of a correction volume, by successive executions of an echo planar imaging sequence. The MR scanner is also operated to acquire third and fourth correction data sets respectively from third and fourth correction sub-volumes, also by successive executions of the echo planar imaging sequence. A first item of correction information is ascertained from the first and second correction data sets, and a second item of correction information is ascertained from the third and fourth correction data sets. The first and second items of correction information are then used to correct scan data, also acquired with the MR scanner.

16 Claims, 4 Drawing Sheets

(56) References Cited

U.S. PATENT DOCUMENTS

| | | | | |
|---|---|---|---|---|
| 5,923,168 | A * | 7/1999 | Zhou | G01R 33/56581 |
| | | | | 324/307 |
| 6,057,685 | A * | 5/2000 | Zhou | G01R 33/56509 |
| | | | | 324/306 |
| 6,700,374 | B1 * | 3/2004 | Wu | G01R 33/56554 |
| | | | | 324/306 |
| 2001/0008376 | A1 * | 7/2001 | Mock | G01R 33/56554 |
| | | | | 324/307 |
| 2006/0066308 | A1 * | 3/2006 | Hinks | G01R 33/56554 |
| | | | | 324/309 |
| 2011/0234221 | A1 * | 9/2011 | Feiweier | G01R 33/56518 |
| | | | | 324/307 |
| 2011/0260726 | A1 | 10/2011 | Techavipoo et al. | |
| 2012/0313640 | A1 | 12/2012 | Pfeuffer | |
| 2013/0272591 | A1 * | 10/2013 | Xue | G06T 11/003 |
| | | | | 382/131 |
| 2014/0266195 | A1 * | 9/2014 | Levin | G01R 33/56509 |
| | | | | 324/309 |
| 2015/0241537 | A1 * | 8/2015 | Dannels | G01R 33/56554 |
| | | | | 324/309 |
| 2016/0018500 | A1 * | 1/2016 | Morita | A61B 5/055 |
| | | | | 324/309 |
| 2016/0041248 | A1 * | 2/2016 | Chen | G01R 33/283 |
| | | | | 324/309 |
| 2016/0299208 | A1 * | 10/2016 | Shigeta | G01R 33/56554 |

OTHER PUBLICATIONS

Zeller et. al.; "Respiration Impacts Phase Difference-Based Field Maps in Echo Planar Imaging"; Magnetic Resonance in Medicine vol. 72; pp. 446-451; (2014).

Chen et al.: "Removal of EPI Nyquist Ghost Artifacts With Two-Dimensional Phase Correction"; Magnetic Resonance in Medicine; vol. 51; pp. 1247-1253; (2004).

Zeller, et.al.: "Phase-Labeled Reference EPI for Frequency-Segmented Inhomogeneity Corrections (PREFICS", in: Magn Reson Med, pp. 1-6,( 2013).

Hoge. et al; "Robust EPI Nyquist Ghost Elimination via Spatial and Temporal Encoding"; Magnetic Resonance in Medicine; vol. 64; pp. 1781-1791; (2010).

Walsh et al.: "Adaptive Reconstruction of Phased Array MR Imagery"; Magnetic Resonance in Medicine vol. 43, pp. 682-690; (2000).

* cited by examiner

METHOD AND APPARATUS FOR THE CORRECTION OF MAGNETIC RESONANCE SCAN DATA

BACKGROUND OF THE INVENTION

Field of the Invention

The invention concerns a method for the correction of magnetic resonance scan data, and a magnetic resonance device and a non-transitory data storage medium that implement such a method.

Description of the Prior Art

In a magnetic resonance (MR) apparatus, also called a magnetic resonance tomography system, the body of an examination person, in particular a patient, to be examined is placed in an MR data acquisition scanner and conventionally exposed therein to a relatively high basic magnetic field, for example of 1.5 or 3 or 7 tesla, produced by a basic field magnet of the scanner. In addition, gradient switchings are activated by the operation of gradient coils. Radio-frequency pulses, for example excitation pulses, are then emitted by a radio-frequency antenna unit by suitable antenna devices, and this leads to the nuclear spins of specific atoms, excited in a resonant manner by these radio-frequency pulses being tilted by a defined flip angle with respect to the magnetic field lines of the basic magnetic field. As the nuclear spins relax, radio-frequency signals, what are known as magnetic resonance signals, are emitted therefrom, which are received by suitable radio-frequency antennae and then processed further. Finally, the desired image data can be reconstructed from the raw data acquired in this way.

For a specific scan, a specific magnetic resonance sequence, also called a pulse sequence, should be emitted, which is composed of a sequence of radio-frequency pulses, for example excitation pulses and refocusing pulses, and appropriate gradient switching operations that are to be emitted in a coordinated manner in various gradient axes in various directions. At a time appropriate therewith, readout windows are set, and these specify the periods in which the induced magnetic resonance signals are detected.

A known method for magnetic resonance imaging is an echo planar imaging method, which is also called echo planar imaging (EPI). The echo planar imaging method is implemented using an echo planar imaging magnetic resonance sequence (EPI sequence). In an EPI sequence of this kind, multiple phase-coded echoes are successively generated by gradient refocusing in order to fill a raw data matrix in a memory, called k-space. A sequence of echoes of this kind is also called an EPI echo train. The EPI echo train is typically recorded following a single, possibly selective, radio-frequency excitation. Iteration of a row of a k-space to be recorded is typically carried out between the echoes by gradient switching operations in the phase coding direction.

The PLACE imaging method is known from the article by Xiang and Ye, "Correction for Geometric Distortion and N/2 Ghosting in EPI by Phase Labeling for Additional Coordinate Encoding (PLACE)", Magnetic Resonance in Medicine 57:731-741 (2007), PLACE stands for phase labeling for additional coordinate encoding. The PLACE imaging method allows fast acquisition of a shift map and/or a B0 field map using magnetic resonance image data, known as correction data sets, acquired by execution of an echo planar imaging method. In the PLACE imaging method, data from a correction volume are acquired twice, in rare cases even three or four times, wherein the second acquisition is phase shifted with respect to the first acquisition, in particular in a phase coding direction. The shift map and/or B0 field map can be calculated from the correction data sets acquired in the first and second acquisitions, as described in detail in the document by Xiang and Ye. The shift map and/or B0 field map can then be used for correction of magnetic resonance scan data. In this connection the shift map and/or the B0 field map can be used, in particular, for correction of inhomogeneities in a main magnetic field of the magnetic resonance device. Original positions, for example, of distorted and/or shifted image points in magnetic resonance scan data, can be restored using the shift map.

In typical applications an examination volume for magnetic resonance imaging, and therewith also a correction volume of the PLACE imaging method, is composed of multiple parallel slices which form a slice stack. In the conventional PLACE imaging method, first the entire correction volume, i.e. the entire slice stack, is completely acquired in the first acquisition and then the entire correction volume is completely acquired again in the second acquisition. In the conventional PLACE imaging method there is accordingly a time difference from a repetition time, which is required for the acquisition of the entire correction volume, between the two repetitions of the acquisition of the same slice of the correction volume.

SUMMARY OF THE INVENTION

An object of the invention is to enable improved correction of magnetic resonance scan data.

The inventive method for magnetic resonance imaging of an examination object by operation of a magnetic resonance scanner includes the following method steps.

A first correction data set is acquired by execution of an echo planar imaging (data acquisition sequence) method from a first correction sub-volume of a correction volume.

A second correction data set is acquired from the first correction sub-volume, by another execution of the echo planar imaging method (data acquisition sequence), with the second correction data set being acquired phase shifted in relation to the first correction data set, and the first correction data set and second correction data set being acquired one immediately after the other.

A first item of correction information is ascertained in a computer from the first correction data set and the second correction data set.

A third correction data set is acquired from a second correction sub-volume of the correction volume, by another execution of the echo planar imaging method (data acquisition sequence).

A fourth correction data set is acquired from the second correction sub-volume by another execution of the echo planar imaging method (data acquisition sequence), with the fourth correction data set being acquired phase shifted in relation to the third correction data set, and the third correction data set and fourth correction data set being acquired one immediately after the other.

A second item of correction information is ascertained in the computer from the third correction data set and the fourth correction data set.

A magnetic resonance scan data set is acquired from an examination volume.

The magnetic resonance scan data are corrected in the computer using the first item of correction information and second item of correction information.

The examination object can be a patient, a training person, an animal or a phantom. The examination volume, also called the field of view (FOV), can be a volume that is mapped (represented) in the recorded magnetic resonance image data. The examination volume is typically set by a user, for example on a localizer. Of course the examination volume can alternatively or additionally also be set automatically, for example on the basis of a chosen protocol.

The correction volume can correspond to the examination volume. The correction volume can also be designed to be different spatially from the examination volume, for example greater or smaller than the examination volume and/or be spatially shifted and/or rotated with respect to the examination volume. It can then be advantageous to interpolate the correction information spatially from the correction volume on the examination volume. The entire correction volume includes the first correction sub-volume and the second correction sub-volume. The first correction sub-volume can be designed to be spatially disjunct from the second correction sub-volume.

The first correction sub-volume and the second correction sub-volume together can form the correction volume. In addition to the first correction sub-volume and the second correction sub-volume, the correction volume can alternatively also include at least one further correction sub-volume that is spatially disjunct from the first correction sub-volume and second correction sub-volume. Further correction data sets are then acquired from the at least one further correction sub-volume from the further correction data sets. Acquisition of the further correction data sets can occur analogously to acquisition of the first and second correction data sets or the third and fourth correction data sets solely from a different correction sub-volume of the correction volume. At least one further item of correction information can then be ascertained from the further correction data sets, and the magnetic resonance scan data can then be corrected also using the at least one further item of correction information.

The magnetic resonance scan data can be raw data that are typically not directly available to an expert for the purpose of diagnosis. The magnetic resonance scan data can also be magnetic resonance image data which can be displayed on a display unit and/or made available to an expert in order to make a diagnosis. The magnetic resonance scan data can also partly include the first, second, third and fourth correction data sets and/or be reconstructed from the first, second, third and fourth correction data sets. Of course it is also conceivable for the first, second, third and fourth correction data sets to be acquired in addition to the magnetic resonance scan data.

The first item of correction information can be ascertained from the first and second correction data sets and the second item of correction information can be ascertained from the third and fourth correction data sets using a method known to those skilled in the art, for example as described in the aforementioned article by Xiang and Ye. The correction of the magnetic resonance scan data using the first correction information and the second correction information can be a correction of a first part of the magnetic resonance scan data using the first correction information and a correction of a second part of the magnetic resonance scan data using the second correction information. The first part of the magnetic resonance scan data can be acquired from a first sub-volume of the examination volume, which corresponds to the first correction sub-volume, while the second part of the magnetic resonance scan data can be acquired from a second sub-volume of the examination volume, which corresponds to the second correction sub-volume.

The magnetic resonance scan data can be corrected using the first item of correction information and the second item of correction information by a method known to those skilled in the art. The first correction information and the second correction information can be, for example, parts of a B0 field map and/or pixel shift map, using which the magnetic resonance scan data are corrected. In this context the first correction information and the second correction information can also be used for the correction of artifacts in the magnetic resonance scan data, such as, in the aforementioned article by Xiang and Ye. For example, geometric distortions and/or ghosting artifacts, which occur in the phase coding direction as a consequence of undesirable signal modulations during EPI recordings that last a relatively long time, can be corrected by using the first item of correction information and the second item of correction information. The corrected magnetic resonance scan data and/or magnetic resonance image data reconstructed from the corrected magnetic resonance scan data can then be emitted as an output data file, for display to a user on a display monitor, and/or for storage in a database.

The acquisition of the first correction data set and the second correction data set so as to be phase shifted in relation to each other means that the first correction data set and the second correction data set are entered into k-space along respective trajectories that are shifted in relation to each other by a phase shift in the phase coding direction (which defines one axis of k-space). The first correction data set and the second correction data set can have a phase shift of one phase blip or two phase blips or three phase blips. A phase blip is a shift in the phase coding direction that is caused by a small gradient pulse of the phase coding gradient of the EPI sequence. The shift in the phase coding direction can also be achieved by the use of different echo times when acquiring the first correction data set and second correction data set. Of course a larger phase shift between the first correction data set and the second correction data set can also exist. The k space respective trajectories, which are used for acquiring the first correction data set and the second correction data set, are shifted by one or more line(s) in the phase coding direction in this way. The same applies to the acquisition of the third correction data set and fourth correction data set in a manner phase-shifted in relation to each other. There is a first phase shift between the first correction data set and the second correction data set, and a second phase shift between the third correction data set and the fourth correction data set, with the first phase shift being equal to the second phase shift.

Acquisition of the first, second, third and fourth correction data sets is implemented by the operation of a magnetic resonance scanner. That the first correction data set and second correction data set are acquired immediately, in succession, for example by acquisition of the second correction data set beginning as soon as acquisition of the first correction data set is finished. In this way acquisition of the second correction data set advantageously directly follows acquisition of the first correction data set. An interval between the start times of acquisition of the first correction data set and of the second correction data set can in this way be less than 250 ms, advantageously less than 150 ms, particularly advantageously less than 100 ms, and most advantageously less than 50 ms. No other scan data is acquired between acquisition of the first correction data set and of the second correction data set. The third correction data set and the fourth correction data set can be acquired one immediately after the other in the same way as just described.

In contrast to the conventional PLACE imaging method, in which first the entire correction volume is acquired and is then repeatedly acquired again in a phase-shifted manner, the inventive process provides acquisition of the correction volume in sections of each of two scans, which are phase shifted in relation to each other. In this way, according to the invention, first the first correction sub-volume is acquired in a phase shifted manner in two immediately successive repetitions and later the second correction sub-volume is acquired in a phase shifted manner in two immediately successive repetitions. In other words, phase-shifted repetitions of acquisition of parts of the correction volume should occur even before acquisition of the entire correction volume is complete. The procedure is preferably performed slice-by-slice, as described in more detail below.

This procedure enables good correction of the magnetic resonance scan data, because the interval between repeated acquisition of the correction sub-volumes can be significantly reduced compared to the conventional PLACE imaging method. In this way it can be ensured that the correction data sets from which the correction information is ascertained, for example the first correction data set and the second correction data set, can be acquired consistently in relation to each other. In this way the effect of a movement, such as a respiratory movement and/or a cardiac movement and/or a movement of limbs, of the examination object on the repeated acquisition of the correction data sets can be reduced. For example, a change in a lung position or a change in an oxygen concentration between different respiratory states can exert an effect on the phase of acquired magnetic resonance scan data in a lung region of the examination object and/or in a region of the body of the examination object positioned at a distance from the lung region. The first correction data set and the second correction data set in accordance with the invention are therefore acquired in the same respiratory state of the examination object. The quality of the first item of correction information and the second item of correction information thus can be increased, because this is less adversely affected by movement of the examination object. With the inventive procedure the sensitivity of the correction of the magnetic resonance scan data to movement of the examination object can be reduced in this way.

In an embodiment, the first correction sub-volume constitutes a first partial slice stack of the correction volume that has, at most, ten first slices of the correction volume that has, and the second correction sub-volume constitutes a second partial slice stack of the correction volume that has, at most, ten second slices of the correction volume. The first correction sub-volume or the second correction sub-volume preferably are only a portion of the slices of the correction volume, namely, at most, 50 percent of the slices of the correction volume, more preferably at most 30 percent of the slices of the correction volume, more preferably at most 15 percent of the slices of the correction volume, and most preferably at most 5 percent of the slices of the correction volume. The first partial slice stack of the correction volume has at most six, preferably at most four, more preferably at most three, and most preferably at most two first slices of the correction volume. The second partial slice stack of the correction volume has at most six, preferably at most four, more preferably at most three, and most advantageously at most two second slices of the correction volume. The reduction in the number of slices of the correction sub-volume makes it possible to further reduce an interval between the repeated acquisition of the correction sub-volumes. In this way, the sensitivity of ascertainment of the first and second items of correction information to movements of the examination object can be reduced further.

In another embodiment, the first correction sub-volume is a single first slice of the correction volume and the second correction sub-volume constitutes a single second slice of the correction volume. In this way two correction data sets that are phase shifted in relation to each other are acquired one immediately after the other, in particular for the same slice respectively, from which sets an item of correction information is then ascertained. For example, the first correction data set is acquired from a specific slice of the correction volume and directly thereafter the second correction data set is acquired from the same slice of the correction volume in a manner phase shifted in relation to first correction data set. The third and fourth correction data sets can be analogously acquired one immediately after the other from the same slice. This same slice being different from the slice of the correction volume from which the first and second correction data sets are acquired. In other words, the two correction data sets should be acquired for a single slice, one immediately after the other, before further correction data sets are acquired for a further slice. Because the correction sub-volumes have only one slice, the interval between the repeated acquisition of the correction sub-volumes can be particularly advantageously shortened. In this way, the sensitivity of ascertainment of the first and second items of correction information to movements of the examination object can be particularly advantageously reduced.

In another embodiment, when acquiring the first correction data, a first radio-frequency excitation pulse is used, when acquiring the second correction data set a second radio-frequency excitation pulse is used, when acquiring the third correction data set a third radio-frequency excitation pulse is used and when acquiring the fourth correction data set a fourth radio-frequency excitation pulse is used. The excitation pulses are used to excite the spins so the magnetic resonance signals for creating the correction data sets can be acquired. The magnetic resonance signals, from which the first, second, third and fourth correction data sets are created, are each acquired in different readout trains. A different excitation pulse should precede the different readout trains according to this embodiment. In this way, four excitation pulses thus are used to acquire the four correction data sets therefore. The use of separate excitation pulses to acquire the first, second, third and fourth correction data sets has the advantage that a spin ensemble for acquiring the magnetic resonance signals, from which the first, second, third and fourth correction data sets are created, is excited once again in each case. When reading out the magnetic resonance signals, from which the first, second, third and fourth correction data sets are created, the spins therefore advantageously each have the same excitation state. In this way the same conditions, for example the same geometric distortions, exist when acquiring the first, second, third and fourth correction data sets. This achieves accurate consistency in the scan conditions, particularly during acquisition of the first and second correction data sets, or during acquisition of the third and fourth correction data sets. The quality of the first item of correction information and second item of correction information thus can be improved further.

The excitation pulses of the radio-frequency excitation pulse set can typically have a flip angle of 90°. As described in the following paragraph, smaller flip angles can also be used for the excitation pulses. In particular applications it can be advantageous for the second radio-frequency excitation pulse and the fourth radio-frequency excitation pulse to be configured as refocusing pulses. The second radio-frequency excitation pulse and the fourth radio-frequency excitation pulse then have a flip angle of more than 90°, advantageously 180°. In this way a magnetization excited by the first radio-frequency excitation pulse and the third radio-frequency excitation pulse can also be used when acquiring the second correction data set and the fourth correction data set.

In another embodiment, at least one radio-frequency excitation pulse from a radio-frequency excitation pulse set, which includes the first radio-frequency excitation pulse, the second radio-frequency excitation pulse, the third radio-frequency excitation pulse and the fourth radio-frequency excitation pulse, has a flip angle of less than 50°. In particular, each radio-frequency excitation pulse of the radio-frequency excitation pulse set has a flip angle of less than 50°. The at least one radio-frequency excitation pulse, in particular each radio-frequency excitation pulse of radio-frequency excitation pulse set, has a flip angle of less than 30°, preferably of less than 15°, more preferably of less than 10°, and most preferably of less than 5°. This procedure is based on the consideration that when creating the first item of correction information from the first and second correction data sets, or when creating the second item of correction information from the third and fourth correction data sets, a lower signal-to-noise ratio in the first and second correction data sets or the third and fourth correction data sets, which is caused by the use of smaller flip angles, is typically of no consequence. Instead, the first item of correction information can be ascertained from the first and second correction data sets, or the second item of correction information from the third and fourth correction data sets using the different image phases in the first and second correction data sets or third and fourth correction data sets. This information is independent of the flip angle used when acquiring the correction data sets. Radio-frequency excitation pulses with different flip angles can also be used for acquiring the first and second correction data sets or the third and fourth correction data sets since different image contrasts are not typically a problem when creating the first and second items of correction information. A reduction in the flip angle of the at least one radio-frequency excitation pulse has the advantage that the stationary state (steady state) is affected to a particularly small extent by the at least one radio-frequency excitation pulse.

In another embodiment, first radio-frequency excitation pulse and the second radio-frequency excitation pulse have different first phases from each other and the third radio-frequency excitation pulse and the fourth radio-frequency excitation pulse have different second phases from each other. In this way a radio-frequency spoiling between acquisition of the first and second correction data sets or of the third and fourth correction data sets can be implemented. This avoids signal excitations from the first correction data set affecting acquisition of the second correction data set, or signal excitations from the third correction data set affecting acquisition of the fourth correction data set. In this way the same recording conditions can be ensured during acquisition of the first and second correction data sets, and acquisition of the third and fourth correction data sets, respectively.

In another embodiment, between acquisition of the first and second correction data sets, a first spoiler gradient pulse is activated for dephasing a residual magnetism, and between acquisition of the third correction data set and fourth correction data set a second spoiler gradient pulse is activated for dephasing a residual magnetism. The first spoiler gradient pulse is activated following conclusion of the EPI readout train, which is carried out in order to acquire the magnetic resonance signals for the first correction data set. The first spoiler gradient pulse is activated before the second radio-frequency excitation pulse, which is activated in order to acquire the second correction data set. The second spoiler gradient pulse is analogously activated following acquisition of the third correction data set and before the start of acquisition of the fourth correction data set. The first spoiler gradient pulse dephases a residual magnetism that is present following acquisition of the first correction data set. In the same way the second spoiler gradient pulse dephases a residual magnetism that is present following acquisition of the third correction data set. In this way the same recording conditions can be ensured during acquisition of the first and second correction data sets, and acquisition of the third and fourth correction data sets, respectively.

In another embodiment, the first correction data set, the second correction data set, the third correction data set and the fourth correction data set are acquired before acquisition of the magnetic resonance scan data. In this way the correction data sets can be acquired in a pre-scan before the actual acquisition of the magnetic resonance scan data. The pre-scan can be implemented particularly quickly. Acquisition of the first, second, third and fourth correction data sets thus can be complete before acquisition of the magnetic resonance scan data.

In another embodiment, the acquisition of the magnetic resonance scan data includes a first scan of the examination volume, a second scan of the examination volume and a third scan of the examination volume, wherein the first correction data set and the second correction data set are acquired between the first scan and the second scan of the examination volume and the third correction data set and the fourth correction data set are acquired between the second scan and the third scan of the examination volume. In this way the examination volume is acquired repeatedly, in at least three scans. Magnetic resonance scan data from the entire examination volume are acquired in the first scan, second scan and third scan. A time series scan of the examination volume, such as for a functional magnetic resonance examination, can be carried out in this way. The claimed procedure can of course also be carried out analogously for further scans of the examination volume. The magnetic resonance scan data and the correction data sets can be advantageously alternately acquired in this way. This can be expedient, for example, if the correction data sets are to be updated during the ongoing scanning of the magnetic resonance scan data. Furthermore, an overall scan time for recording the magnetic resonance scan data and the correction data sets can be reduced in this way. As one suitable option a first partial slice stack, in particular a first single slice, of the correction volume can be repeatedly acquired between the first scan and the second scan of the examination volume. A second partial slice stack, in particular a second single slice, of the correction volume can then be repeatedly acquired between the second scan and the third scan of the examination volume. The first partial slice stack and the second partial slice stack can have different slices of the correction volume from each other. The slices of the partial slice stack of the correction volume, which are acquired between the scans of the examination volume, can be cyclically shifted in this way. During acquisition of the correction data sets, which is inserted between the scans of the examination volume, a matrix size of the correction data sets can be reduced to further reduce the scan time for acquisition of the correction data sets. An interpolation of the scan data of the correction data sets for ascertaining the correction information can occur in the process.

In another embodiment, the first correction data set, the second correction data set, the third correction data set and the fourth correction data set form at least part of the magnetic resonance scan data. Of course the correction data sets can also form all of the magnetic resonance scan data. The slices recorded during acquisition of the correction data sets can be combined in this way to form at least part of the examination volume. A cyclical shift of the slices during acquisition of the correction data sets, which form the magnetic resonance scan data at least in part, can occur if the examination volume, as described in the preceding paragraph, is to be repeatedly recorded. The correction data sets can fulfill an advantageous dual role in this proposed procedure. First, the correction data sets can be at least a part of the magnetic resonance scan data. Secondly, the correction data can be used for correction of the magnetic resonance scan data. In this way the scan time can be reduced further and/or a particularly appropriate correction of the magnetic resonance scan data can be achieved due to the consistency of the magnetic resonance scan data and the correction data sets used for correction of the magnetic resonance scan data.

The inventive magnetic resonance apparatus has a scanner that is operated to acquire the first correction data set, the second correction data set, the third correction data set, the fourth correction data set, and a scan data set and a computer configured to execute the inventive method as described above.

The magnetic resonance apparatus is designed for carrying out a method for magnetic resonance imaging an examination object. The MR data acquisition scanner is operated to acquire a first correction data set, by execution of an echo planar imaging sequence, from a first correction sub-volume of a correction volume. The MR data acquisition scanner is operated to acquire a second correction data set, by execution of the echo planar imaging sequence, from the first correction sub-volume, with the second correction data set being acquired phase shifted in relation to the first correction data set, and the first correction data set and the second correction data set being acquired one immediately after the other. The computer (or a processor thereof) is configured to ascertain a first item of correction information from the first correction data set and the second correction data set. The MR data acquisition scanner is operated to acquire a third correction data set, by execution of the echo planar imaging sequence, from a second correction sub-volume of the correction volume. The MR data acquisition scanner is operated to acquire a fourth correction data set, by execution of the echo planar imaging sequence, from the second correction sub-volume, with the fourth correction data set being acquired phase shifted in relation to the third correction data set, and the third correction data set and the fourth correction data being acquired one immediately after the other. The computer (or a processor thereof) is configured to ascertain a second item of correction information from the third correction data set and the fourth correction data set. The MR data acquisition scanner is operated to acquire magnetic resonance scan data from an examination volume. The computer (or a processor thereof) is configured to correct the magnetic resonance scan data using the first item of correction information and the second item of correction information.

The ascertaining of the first and second items of correction information, and the correction of the scan data, can take place respectively in processors or other modules of the computer. Alternatively, the processors may be individual stand-alone processors that are connected via a bus or a network, or all of the processors may be combined as a single overall processor within the computer.

The invention also encompasses a non-transitory, computer-readable data storage medium that can be loaded directly into a memory of a programmable computer of a magnetic resonance computer and has program code that cause the inventive method to be implemented when the code is executed in the computer of the magnetic resonance device. The inventive method can consequently be carried out quickly, robustly and in a manner that can be repeated identically. The computer must have, for example, an appropriate main memory, an appropriate graphics card or an appropriate logic unit, so the respective method steps can be carried out efficiently.

Examples of electronically readable data carriers are a DVD, magnetic tape or a USB stick, on which electronically readable code, in particular software is stored.

The advantages of the inventive storage medium and of the inventive magnetic resonance apparatus essentially correspond to the advantages of the inventive method, which have been described above in detail. Features, advantages or alternative embodiments mentioned in connection with the method are similarly applicable transferred to the other aspects of the invention. The corresponding functional features of the method are performed by appropriate modules, in particular by hardware modules.

DESCRIPTION OF THE PREFERRED EMBODIMENTS

Figure 1:
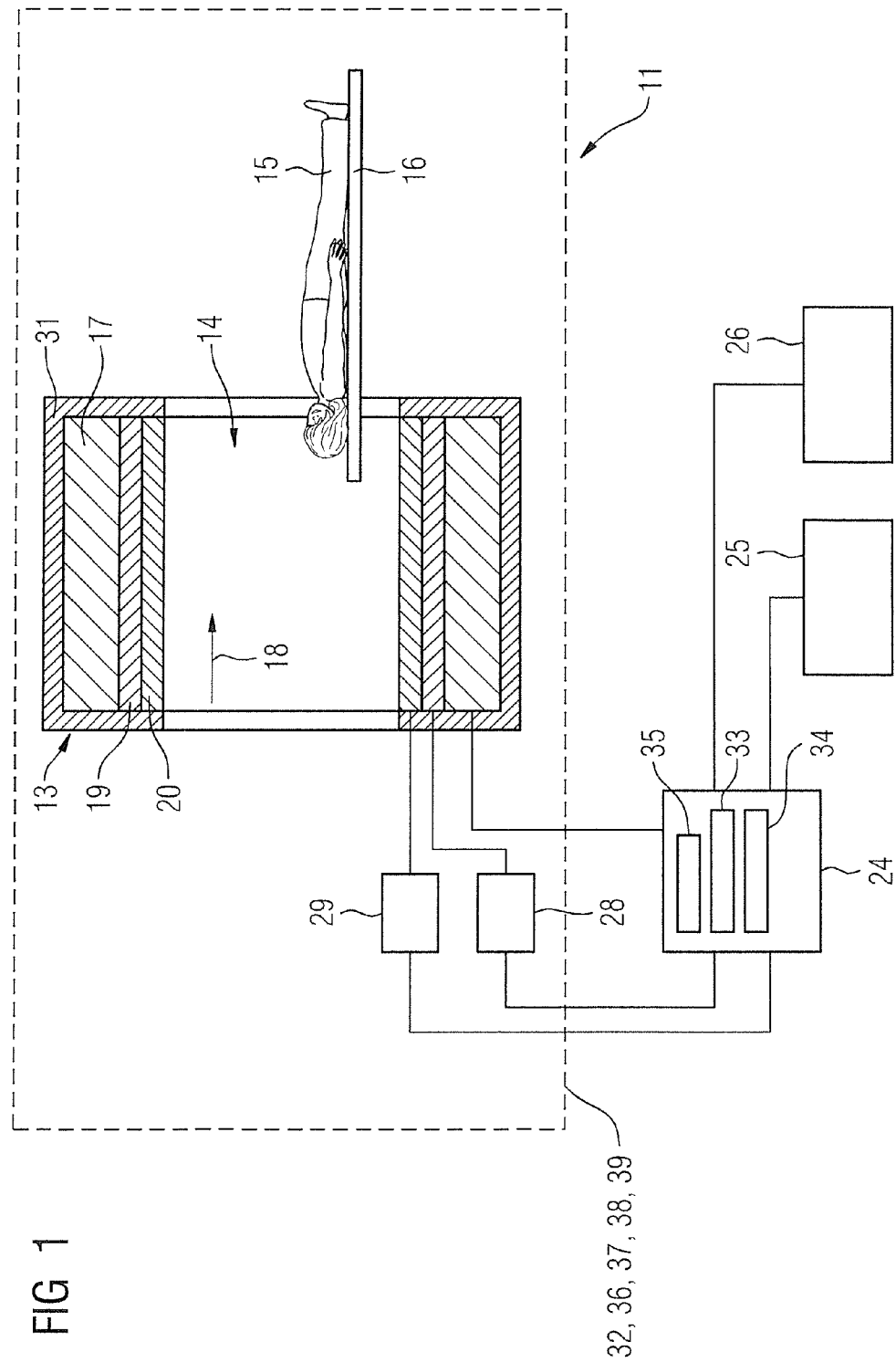
FIG. 1 shows an inventive magnetic resonance apparatus in a block diagram.

FIG. 1 schematically shows an inventive magnetic resonance apparatus 11. The magnetic resonance apparatus 11 has an MR data acquisition scanner 13, having a basic magnet 17 that generates a strong and constant basic magnetic field 18. The MR data acquisition scanner 13 has a cylindrical patient-receiving region 14 for receiving an examination object 15, in the present case a patient. The patient-receiving region 14 is cylindrically surrounded in a circumferential direction by the scanner 13. The patient 15 can be moved by a patient-positioning device 16 of the magnetic resonance apparatus 11 into the patient-receiving region 14. The patient-positioning device 16 has for this purpose an examination table arranged so as to move inside the scanner 13. The scanner 13 is shielded from the outside by a housing shell 31.

The scanner 13 also has a gradient coil arrangement 19 that is operated to generate magnetic field gradients that are used for spatial encoding the MR signals. The gradient coil arrangement 19 is controlled by a gradient control processor 28. The scanner 13 also has a radio-frequency antenna unit (RF radiator) 20, which is designed in the illustrated case as a body coil permanently integrated in the scanner 13, and a radio-frequency antenna control processor 29. The radio-frequency antenna unit 20 is controlled by the radio-frequency antenna control processor 29 so as to radiate radio-frequency magnetic resonance sequences into an examination space, which is essentially formed by the patient-receiving region 14. The radio-frequency energy radiated by the radio-frequency antenna unit 20 excites selected nuclear spins in the patient 15 so as to cause the excited nuclear spins to deviate from the polarization or alignment produced by the basic magnetic field 18. As the excited nuclear spins relax, they emit magnetic resonance signals. The radio-frequency antenna unit 20 is also designed to receive magnetic resonance signals from the patient 15 (but alternatively other RF coils (local coils) can be used for that purpose).

For controlling the basic field magnet 17, the gradient control processor 28 and the radio-frequency antenna control processor 29, the magnetic resonance apparatus 11 has a computer 24. The computer 24 centrally controls the magnetic resonance apparatus 11, such as to execute a predetermined imaging gradient echo sequence. Control information such as imaging parameters, and reconstructed magnetic resonance images, can be presented to a user on an output interface 25, such as a display monitor 25, of the magnetic resonance apparatus 11. Furthermore, the magnetic resonance apparatus 11 has an input interface 26, via which the user can enter information and/or parameters during a scanning procedure. The computer 24 can include the gradient control processor 28 and/or the radio-frequency antenna control processor 29 and/or the output interface 25 and/or the input interface 26.

In the illustrated case the computer 24 it is schematically shown as having a first ascertaining processor 33, a second ascertaining processor 34 and a correction processor 35. As noted above, although the processors 33, 34 and 35 are schematically shown in FIG. 1 as being within the computer 24, any suitable and appropriately connected combination of processors can be used and two or more of the processors can be combined as one processor. The processors may also be considered as software modules within the computer 24.

The magnetic resonance scanner 13 is operated by the aforementioned components to acquire scan data as well as to acquire a first correction data set, a second correction data set, a third correction data set, and a fourth correction data set.

The magnetic resonance apparatus 11 is therefore designed to carry out the inventive method for magnetic resonance imaging of an examination object.

The illustrated magnetic resonance apparatus 11 can of course have further components that magnetic resonance apparatuses conventionally have. The general manner of operation of a magnetic resonance apparatus is known to those skilled in the art, so a detailed description of the further components is not necessary herein.

Figure 2:
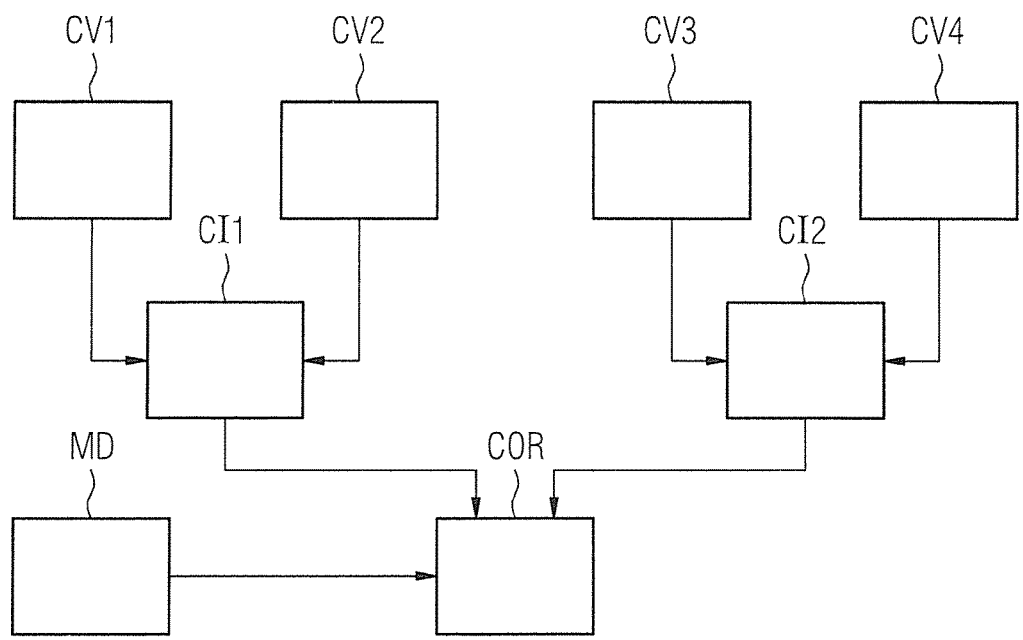
FIG. 2 is a flowchart of a first embodiment of the inventive method.

FIG. 2 is a flowchart of a first embodiment of an inventive method for the correction of magnetic resonance scan data.

In a first method step CV1 a first correction data set is acquired, by execution of an echo planar imaging sequence, from a first correction sub-volume of a correction volume by operation of the MR data acquisition scanner 13.

In a further method step CV2, a second correction data set is acquired, by execution of the echo planar imaging sequence, from the first correction sub-volume by operation of the MR data acquisition scanner 13. The second correction data set is acquired phase shifted in relation to the first correction data set, and the first correction data set and the second correction data set are acquired one immediately after the other.

In a further method step CI1, a first item of correction information is ascertained from the first correction data set and the second correction data set with the first ascertaining processor 33.

In a further method step CV3 a third correction data set is acquired, by execution of the echo planar imaging sequence, from a second correction sub-volume of the correction volume by operation of the MR data acquisition scanner 13.

In a further method step CV4, a fourth correction data set is acquired, by execution of the echo planar imaging sequence, from the second correction sub-volume by operation of the MR data set acquisition scanner 13. The fourth correction data set is acquired phase shifted in relation to the third correction data set, and the third correction data set and fourth correction data set are acquired one immediately after the other.

In a further method step CI2, a second item of correction information is ascertained from the third correction data set and the fourth correction data set, with the second ascertaining processor 34.

In a further method step MD, magnetic resonance scan data are acquired from an examination volume by operation of the MR data acquisition scanner 13.

In a further method step COR, the MR magnetic resonance scan data are corrected using the first correction information and the second correction information, with the correction processor 35. The magnetic resonance scan data corrected in this way, or magnetic resonance image data reconstructed from the corrected magnetic resonance scan data, can then be made available in electronic firm as a data file from the correction processor 35. The corrected or reconstructed data can be displayed on the output interface 25 and/or be stored in a database.

The following description is essentially limited to the differences from the exemplary embodiment in FIG. 2, wherein reference is made with respect to unchanged method steps to the description of the exemplary embodiment in FIG. 2. Method steps that are essentially unchanged are denoted by identical reference numerals.

Embodiments of the inventive method shall be illustrated below in FIG. 3 to FIG. 7 according to their sequence over time. FIG. 3 to FIG. 7 can partially include method steps of the first embodiment of the inventive method according to FIG. 2. In addition, the embodiments of the inventive method shown in FIG. 3 to FIG. 7 can comprise additional method steps and sub-steps. A method sequence alternative to FIG. 3 to FIG. 7, which has only some of the additional method steps and/or sub-steps illustrated in FIG. 3 to FIG. 7, is also conceivable. Of course a method sequence alternative to FIG. 3 to FIG. 7 can also have additional method steps and/or sub-steps.

Figure 3:
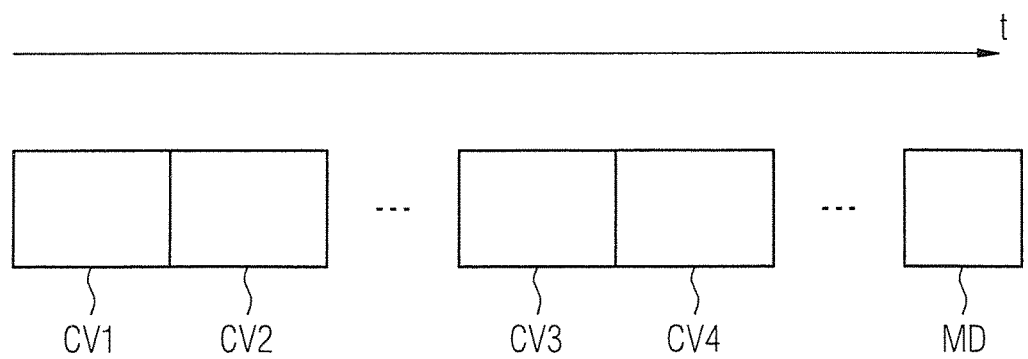
FIG. 3 is a diagram of a sequence over time of a second embodiment of an inventive method.

FIG. 3 shows a diagram of a sequence over time of a second embodiment of an inventive method for the correction of magnetic resonance scan data.

FIG. 3 shows that the first correction data set CV1 and the second correction data set CV2 are acquired one immediately after the other. Acquisition of the second correction data set CV2 immediately follows an acquisition of the first correction data set CV1. Of course there can also be a short break between acquisition of the first correction data set CV1 and acquisition of the second correction data set CV2, but no further scan data are detected during this short break.

There can accordingly be a break between acquisition of the second correction data set CV2 and the third correction data set CV3. Of course acquisition of the third correction data set CV3 can also immediately follow acquisition of the second correction data set CV2, but this is not imperative.

According to FIG. 3 the first correction data set CV1, second correction data set CV2, third correction data set CV3 and fourth correction data set CV4 are acquired before acquisition of the magnetic resonance scan data MD. In this way acquisition of the correction data sets CV1, CV2, CV3, CV4 constitutes a pre-scan which is complete as soon as acquisition of the magnetic resonance scan data MD begins.

In the embodiments of the inventive method shown in FIG. 2 to FIG. 7 the first correction data set CV1 and the second correction data set CV2 are acquired from the same first correction sub-volume. The first correction sub-volume can advantageously constitute a first partial slice stack of the correction volume that has, at most, ten first slices of the correction volume. The first correction sub-volume most advantageously constitutes a single first slice of the correction volume.

In the embodiments of the inventive method illustrated in FIG. 2 to FIG. 7 the third correction data set CV3 and the fourth correction data set CV4 are acquired from the same second correction sub-volume. The second correction sub-volume can advantageously constitute a second partial slice stack of the correction volume that has, at most, ten second slices of the correction volume. The second correction sub-volume most advantageously constitutes a single second slice of the correction volume.

Figure 4:
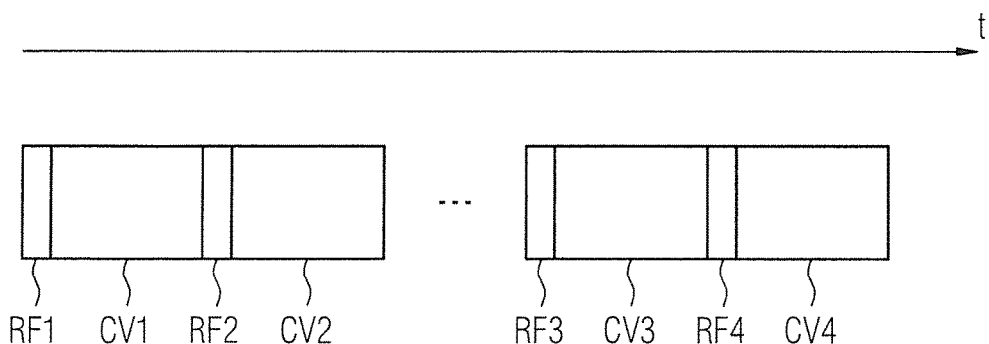
FIG. 4 is a diagram of a sequence over time of a third embodiment of an inventive method.

FIG. 4 shows a diagram of a sequence over time of a third embodiment of an inventive method for the correction of magnetic resonance scan data.

In addition to the method sequence illustrated in FIG. 3, FIG. 4 shows that a first radio-frequency excitation pulse RF1 is used when acquiring the first correction data set CV1, a second radio-frequency excitation pulse RF2 is used when acquiring the second correction data set CV2, a third radio-frequency excitation pulse RF3 is used when acquiring the third correction data set CV3 and a fourth radio-frequency excitation pulse RF4 is used when acquiring the fourth correction data set CV4.

The first radio-frequency excitation pulse RF1 and the second radio-frequency excitation pulse RF2 each excite the spins in the first correction sub-volume. The third radio-frequency excitation pulse RF3 and the fourth radio-frequency excitation pulse RF4 each excite the spins in the second correction sub-volume. The radio-frequency excitation pulses RF1, RF2, RF3, RF4 each occur at the start of acquisition of the correction data sets CV1, CV2, CV3, CV4. An EPI readout train can follow the radio-frequency excitation pulses RF1, RF2, RF3, RF4 in each case for acquisition of the correction data sets CV1, CV2, CV3, CV4.

The first radio-frequency excitation pulse RF1, second radio-frequency excitation pulse RF2, third radio-frequency excitation pulse RF3 and fourth radio-frequency excitation pulse RF4 form a radio-frequency excitation pulse set, wherein at least one radio-frequency excitation pulse RF1, RF2, RF3, RF4 from a radio-frequency excitation pulse set can have a flip angle of less than 50°. Furthermore, the first radio-frequency excitation pulse RF1 and the second radio-frequency excitation pulse RF2 can have different first phases from each other. The third radio-frequency excitation pulse RF3 and the fourth radio-frequency excitation pulse RF4 also can have different second phases from each other.

Figure 5:
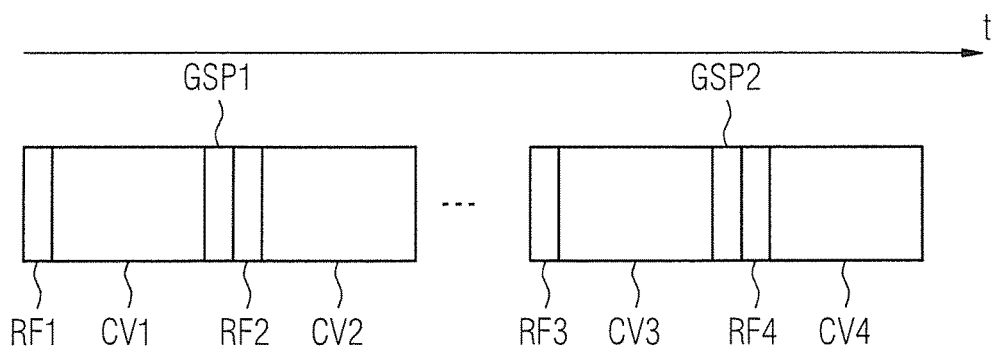
FIG. 5 is a diagram of a sequence over time of a fourth embodiment of an inventive method.

FIG. 5 shows a diagram of a sequence over time of a fourth embodiment of an inventive method for the correction of magnetic resonance scan data.

In addition to the method sequence illustrated FIG. 4, FIG. 5 shows that between acquisition of the first correction data set CV1 and of the second correction data set CV2 a first spoiler gradient pulse GSP1 is activated for dephasing a residual magnetism, and between acquisition of the third correction data set CV3 and of the fourth correction data set CV4 a second spoiler gradient pulse GSP2 is activated for dephasing a residual magnetism.

Figure 6:
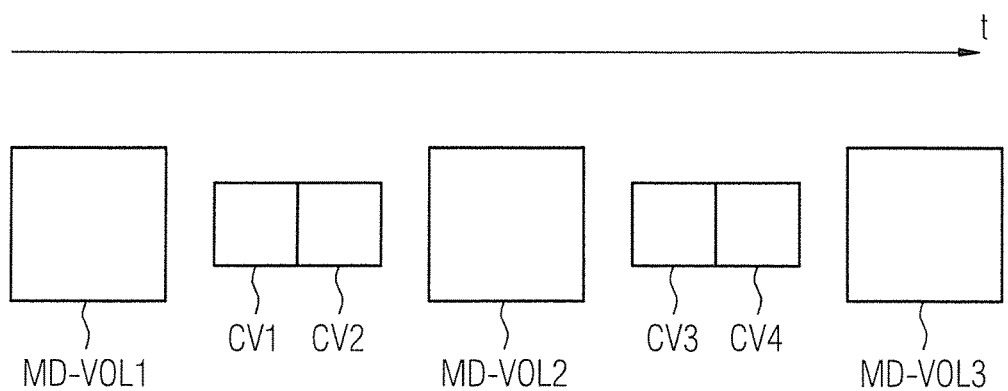
FIG. 6 is a diagram of a sequence over time of a fifth embodiment of an inventive method.

FIG. 6 shows a diagram of a sequence over time of a fifth embodiment of an inventive method for the correction of magnetic resonance scan data.

According to FIG. 6 acquisition of the magnetic resonance scan data MD comprises a first scan MD VOL1 of the examination volume, a second scan MD VOL2 of the examination volume and a third scan MD VOL3 of the examination volume. In this way the examination volume is repeatedly acquired, in particular in a time series, for example in order to examine changes over time in the anatomy of the examination object 15.

According to FIG. 6 the first correction data set CV1 and the second correction data set CV2 are acquired between the first scan MD VOL1 and the second scan MD VOL2 of the examination volume. According to FIG. 6 the third correction data set CV3 and the fourth correction data set CV4 are acquired between the second scan MD VOL2 and the third scan MD VOL3 of the examination volume.

Of course further scans of the examination volume can also take place during acquisitions of the magnetic resonance scan data. Cyclical shifting of the slices acquired in the correction data sets CV1, CV2, CV3, CV4 between the scans MD VOL1, MD VOL2, MD VOL3 of the examination volume can take place in particular.

Figure 7:
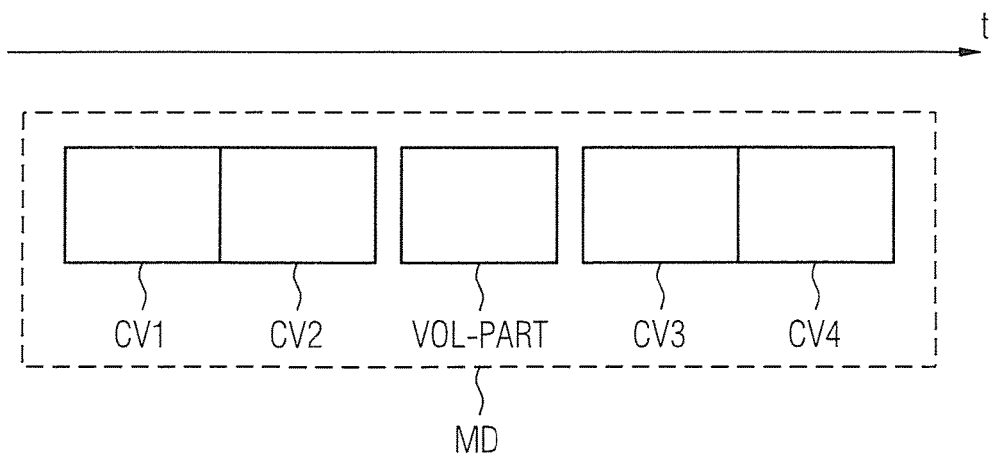
FIG. 7 is shows a diagram of a sequence over time of a sixth embodiment of an inventive method.

FIG. 7 shows a diagram of a sequence over time of a sixth embodiment of an inventive method for the correction of magnetic resonance scan data.

As an alternative to the procedure illustrated in FIG. 3 acquisition of the magnetic resonance scan data MD should not follow acquisition of the correction data sets CV1, CV2, CV3, CV4. Instead, the first correction data set CV1, second correction data set CV2, third correction data set CV3 and fourth correction data set CV4 form at least part of the magnetic resonance scan data.

As an example, the first correction data set CV1 and the second correction data set CV2 can be acquired from a first partial slice stack of the examination volume, in particular from a first slice of the examination volume. The third correction data set CV3 and the fourth correction data set CV2 can be acquired from a second partial slice stack of the examination volume, in particular from a second slice of the examination volume. Between the second correction data set CV2 and the third correction data set CV3 additional magnetic resonance scan data VOL PART can optionally be acquired from a third partial slice stack of the examination volume. This procedure can be continued, wherein cyclical shifting of the slices scanned in the correction data sets CV1, CV2, CV3, CV4 occurs.

The method steps of the inventive method illustrated in FIGS. 2 to 7 are implemented by the computer 24. The computer 24 has the necessary software and/or computer programs for this purpose, which are stored in a memory of the computer 24. The software and/or computer programs have program code (programming instructions) configured to cause the inventive method to be implemented when the code is executed in the computer 24.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for correcting magnetic resonance (MR) scan data of an examination subject, comprising:

operating an MR data acquisition scanner having a basic magnetic (B0) field therein, while an examination subject is situated therein, to acquire a first correction data set, by executing an echo planar data acquisition sequence, from a first correction sub-volume of a correction volume of the examination subject, said first correction data set having a content for use in execution of a correction algorithm that compensates for inhomogeneities in said B0 field;

operating the MR data acquisition scanner, with said B0 field therein, while the examination subject is situated therein, to acquire a second correction data set having a content for use in execution of said correction algorithm, by executing said echo planar data acquisition sequence, from said first correction sub-volume, with the second correction data set being acquired phase-shifted with respect to the first correction data set, and with the first correction data set and the second correction data set being acquired immediately in succession;

providing said first and second correction data sets to a computer and, in said computer, determining a first item of correction information from said first correction data set and said second correction data set by executing said correction algorithm;

operating the MR data acquisition scanner, with said B0 field therein, while the examination subject is situated therein, to acquire a third correction data set having a content for use in execution of said correction algorithm, by executing said echo planar data acquisition sequence, from a second correction sub-volume of said correction volume;

operating the MR data acquisition scanner, with said B0 field therein, while the examination subject is situated therein, to acquire a fourth correction data set having a content for use in execution of said correction algorithm, by executing said echo planar data acquisition sequence, from said second correction sub-volume, with the fourth correction data set being acquired phase-shifted with respect to the third correction data set, and with the third correction data set and the fourth correction data set being acquired in immediate succession;

providing said first and second correction data sets to said computer and, in said computer, determining a second item of correction information from said third correction data set and said fourth correction data set by again executing said correction algorithm;

operating said MR data acquisition scanner, with said B0 field therein, while said examination subject is situated therein, to acquire MR scan data from an examination volume of said examination subject;

providing said MR scan data to said computer and, in said computer, correcting effects of said inhomogeneities in said B0 field on said MR scan data by applying said first item of correction information and said second item of correction information to said MR scan data, and thereby obtaining corrected MR scan data; and making the corrected MR scan data available in electronic form as a data file from said computer.

2. A method as claimed in claim 1 wherein said correction volume comprises a plurality of slices, and operating the MR data acquisition scanner to acquire said first correction sub-volume as a first slice stack of said correction volume comprising a number of first slices that is fewer than said plurality of slices, and operating said MR data acquisition scanner to acquire said second correction sub-volume as a second slice stack of said correction volume comprising a number of second slices that is fewer than said plurality of slices.

3. A method as claimed in claim 2 comprising operating said MR data acquisition scanner to acquire said first correction sub-volume as, at most, ten first slices of said correction volume, and to acquire said second correction sub-volume as, at most, ten second slices of said correction volume.

4. A method as claimed in claim 2 comprising operating said MR data acquisition scanner to acquire said first correction sub-volume as a single first slice of said correction volume, and to acquire said second correction sub-volume as a single second slice of said correction volume.

5. A method as claimed in claim 1 comprising:

operating said MR data acquisition scanner to acquire said first correction data set by radiating a first radio-frequency excitation pulse when executing said echo planar data acquisition sequence;

operating said MR data acquisition scanner to acquire said second correction data set by radiating a second radio-frequency excitation pulse when executing said echo planar data acquisition sequence;

operating said MR data acquisition scanner to acquire said third correction data set by radiating a third radio-frequency excitation pulse when executing said echo planar data acquisition sequence; and operating said MR data acquisition scanner to acquire said fourth correction data set by radiating a fourth radio-frequency excitation pulse when executing said echo planar data acquisition sequence.

6. A method as claimed in claim 5 comprising operating said MR data acquisition scanner to radiate at least one of said first radio-frequency excitation pulse, said second radio-frequency excitation pulse, said third radio-frequency excitation pulse, and said fourth radio-frequency excitation pulse, with a flip angle of less than 50°.

7. A method as claimed in claim 5 comprising operating said MR data acquisition scanner to radiate said first radio-frequency excitation pulse and the second radio-frequency excitation pulse with respectively different first phases from each other, and to radiated said third radio-frequency excitation pulse and said fourth radio-frequency excitation pulse with respectively different second phases from each other.

8. A method as claimed in claim 1 comprising operating said MR data acquisition scanner to activate a first spoiler gradient between acquiring said first correction dataset and said second correction data set, which dephases residual magnetism of nuclear spins in said correction volume that exists after acquiring said first correction data set, and operating said MR data acquisition scanner to activate a second spoiler gradient between acquiring said third correction data set and said fourth correction data set, which dephases residual magnetism that exists in said correction volume after acquiring said third correction data set.

9. A method as claimed in claim 1 comprising operating said MR data acquisition scanner to acquire each of said first correction data set, said second correction data set, said third correction data set, and said fourth correction data set before acquiring said MR scan data.

10. A method as claimed in claim 1 comprising operating said MR data acquisition scanner to acquire said MR scan data in a first scan of the examination volume, a second scan of the examination volume, and a third scan of the examination volume and to acquire first correction data set and said second correction data set between said first scan and said second scan, and to acquire said third correction data set and said fourth correction data set between said second scan and said third scan.

11. A method as claimed in claim 1 comprising operating said MR data acquisition scanner to acquire said first correction data set, said second correction data set, said third correction data set and said fourth correction data set as at least a portion of said MR scan data.

12. A magnetic resonance (MR) apparatus, comprising:
an MR data acquisition scanner;
a computer configured to operate said MR data acquisition scanner having a basic magnetic (B0) field therein, while an examination subject is situated therein, in the scanner to acquire a first correction data set, by executing an echo planar data acquisition sequence, from a first correction sub-volume of a correction volume of the examination subject, said first correction data set having a content for use in execution of a correction algorithm that compensates for inhomogeneities in said B0 field;
said computer being configured to operate the MR data acquisition scanner, with said B0 field therein, while the examination subject is situated therein, to acquire a second correction data set having a content for use in execution of said correction algorithm, by executing said echo planar data acquisition sequence, from said first correction sub-volume, with the second correction data set being acquired phase-shifted with respect to the first correction data set, and with the first correction data set and the second correction data set being acquired immediately in succession;
said computer being configured to determine a first item of correction information from said first correction data set and said second correction data set by executing said correction algorithm;
said computer being configured to operate the MR data acquisition scanner, with said B0 field therein, while the examination subject is situated therein, to acquire a third correction data set having a content for use in execution of said correction algorithm, by executing said echo planar data acquisition sequence, from a second correction sub-volume of said correction volume;
said computer being configured to operate the MR data acquisition scanner, with said B0 field therein, while the examination subject is situated therein, to acquire a fourth correction data set having a content for use in execution of said correction algorithm, by executing said echo planar data acquisition sequence, from said second correction sub-volume, with the fourth correction data set being acquired phase-shifted with respect to the third correction data set, and with the third correction data set and the fourth correction data set being acquired in immediate succession;
said computer being configured to determine a second item of correction information from said third correction data set and said fourth correction data set by again executing said correction algorithm;
said computer being configured to operate said MR data acquisition scanner, with said B0 field therein, while said examination subject is situated therein, to acquire MR scan data from an examination volume of said examination subject;
said computer being configured to correct effects of said inhomogeneities in said B0 field on said MR scan data by applying said first item of correction information and said second item of correction information to said MR scan data, and thereby obtaining corrected MR scan data; and
said computer being configured to make the corrected MR scan data available in electronic form as a data file from said computer.

13. A non-transitory, computer-readable data storage medium encoded with programming instructions, said storage medium being loaded into a computer of a magnetic resonance (MR) apparatus that comprises an MR data acquisition scanner having a basic magnetic (B0) field therein, said programming instructions causing said computer to:
operate said MR data acquisition scanner, while an examination subject is situated therein, to acquire a first correction data set, by executing an echo planar data acquisition sequence, from a first correction sub-volume of a correction volume of the examination subject, said first correction data set having a content for use in execution of a correction algorithm that compensates for inhomogeneities in said B0 field;
operate the MR data acquisition scanner, with said B0 field therein, while the examination subject is situated therein, to acquire a second correction data set having a content for use in execution of said correction algorithm, by executing said echo planar data acquisition sequence, from said first correction sub-volume, with the second correction data set being acquired phase-shifted with respect to the first correction data set, and with the first correction data set and the second correction data set being acquired immediately in succession;
determine a first item of correction information from said first correction data set and said second correction data set by executing said correction algorithm;
operate the MR data acquisition scanner, with said B0 field therein, while the examination subject is situated therein, to acquire a third correction data set having a content for use in execution of said correction algorithm, by executing said echo planar data acquisition sequence, from a second correction sub-volume of said correction volume;
operate the MR data acquisition scanner, with said B0 field therein, while the examination subject is situated therein, to acquire a fourth correction data set having a content for use in execution of said correction algorithm, by executing said echo planar data acquisition sequence, from said second correction sub-volume, with the fourth correction data set being acquired phase-shifted with respect to the third correction data set, and with the third correction data set and the fourth correction data set being acquired in immediate succession;
determine a second item of correction information from said third correction data set and said fourth correction data set by again executing said correction algorithm;
operate said MR data acquisition scanner, with said B0 field therein, while said examination subject is situated therein, to acquire MR scan data from an examination volume of said examination subject;
correct effects of said inhomogeneities in said B0 field on said MR scan data by applying said first item of correction information and said second item of correction information to said MR scan data, and thereby obtaining corrected MR scan data; and make the corrected MR scan data available in electronic form as a data file from said computer.

14. A non-transitory, computer-readable data storage medium as claimed in claim 13, wherein said correction algorithm is used in combination with the Phase Labeling For Additional Coordinate Encoding (PLACE) algorithm.

15. A method as claimed in claim 1, wherein said correction algorithm is used in combination with the Phase Labeling For Additional Coordinate Encoding (PLACE) algorithm.

16. An MR apparatus as claimed in claim 12, wherein said correction algorithm is used in combination with the Phase Labeling For Additional Coordinate Encoding (PLACE) algorithm.

* * * * *